US006650369B2

(12) United States Patent
Koizumi et al.

(10) Patent No.: US 6,650,369 B2
(45) Date of Patent: Nov. 18, 2003

(54) IMAGE SENSING APPARATUS, SIGNAL DETECTION APPARATUS, AND SIGNAL ACCUMULATION APPARATUS (75) Inventors: Toru Koizumi, Yokohama (JP); Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/163,343

(22) Filed: Sep. 30, 1998

(65) Prior Publication Data
US 2003/0137594 A1 Jul. 24, 2003

(30) Foreign Application Priority Data

Oct. 6, 1997 (JP) .............................. 9-272578

(51) Int. Cl.$^7$ .............................................. H04N 5/335
(52) U.S. Cl. ........................ 348/301; 348/308; 348/245
(58) Field of Search ................................ 348/301, 302, 348/304, 308, 241, 250, 245

(56) References Cited

U.S. PATENT DOCUMENTS

| 5,434,619 | A | * | 7/1995 | Yonemoto | 348/308 |
|---|---|---|---|---|---|
| 5,493,423 | A | * | 2/1996 | Hosier | 348/300 |
| 5,793,423 | A | * | 8/1998 | Hamasaki | 348/302 |
| 5,898,168 | A | | 4/1999 | Gowda et al. | 250/208.1 |
| 5,933,190 | A | * | 8/1999 | Dierickx et al. | 348/302 |
| 5,962,844 | A | * | 10/1999 | Merrill et al. | 348/308 |
| 6,097,022 | A | * | 8/2000 | Merrill et al. | 348/300 |
| 6,115,066 | A | * | 9/2000 | Gowda et al. | 348/308 |
| 6,166,767 | A | * | 12/2000 | Watanabe | 348/301 |
| 6,344,877 | B1 | * | 2/2002 | Gowda et al. | 348/308 |

FOREIGN PATENT DOCUMENTS

| EP | 0 905 788 | 3/1999 |
|---|---|---|
| WO | WO 98/56168 | 12/1998 |

OTHER PUBLICATIONS

B. Ackland et al., "Camera on a Chip", IEEE International Solid–State circuits Conference, Feb. 8, 1996, pp. 22–25.
S. Mendis et al., "A 128 × 128 CMOS Active Pixel Image Sensor for Highly Integrated Imaging Systems", IEEE International Electron Devices Meeting Tech. Digest, Dec. 1993.

* cited by examiner

Primary Examiner—Wendy R. Garber
Assistant Examiner—Lin Ye
(74) Attorney, Agent, or Firm—Fitzpatrick, Cella, Harper & Scinto (57) ABSTRACT There is provided an image sensing apparatus comprising a plurality of pixels each including a photoelectric conversion unit, an amplification unit for amplifying a signal from the photoelectric conversion unit, a transfer unit for transferring the signal from the photoelectric conversion unit to the photoelectric conversion unit, and a read control unit for controlling a read of the signal from the amplification unit under control of the voltage level of the input portion of the amplification unit.

9 Claims, 11 Drawing Sheets

LIGHT-RECEIVING PORTION

FIG. 7

INPUT VOLTAGE OF SOURCE FOLLOWER

IMAGE SENSING APPARATUS, SIGNAL DETECTION APPARATUS, AND SIGNAL ACCUMULATION APPARATUS

BACKGROUND OF THE INVENTION

1. Field of the Invention

The present invention relates to an image sensing apparatus, a signal detection apparatus, and a signal accumulation apparatus and, more particularly, to read control of a signal from a pixel or cell.

2. Related Background Art

Figure 1A:
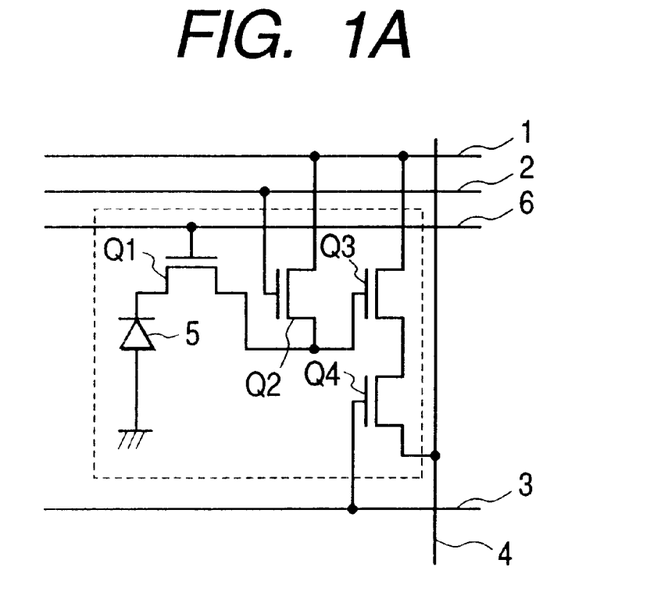
FIGS. 1A and 1B are equivalent circuit diagrams each showing one conventional pixel.
Figure 1B:
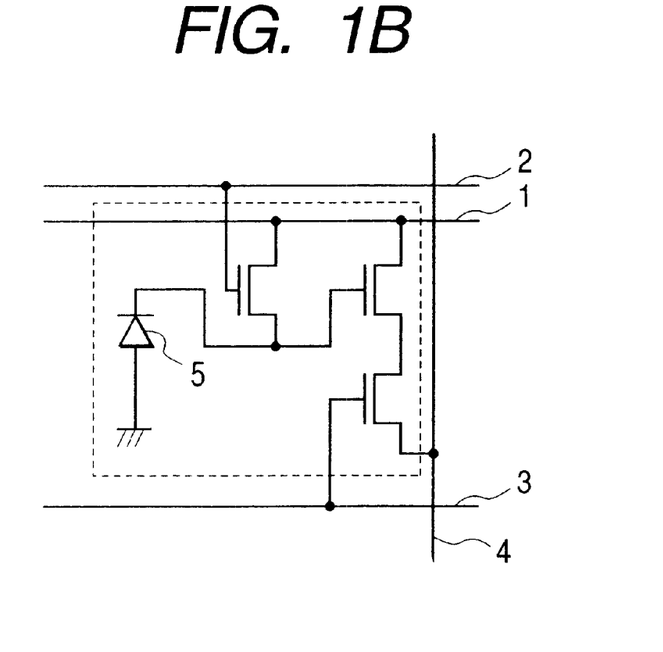
Figure 2:
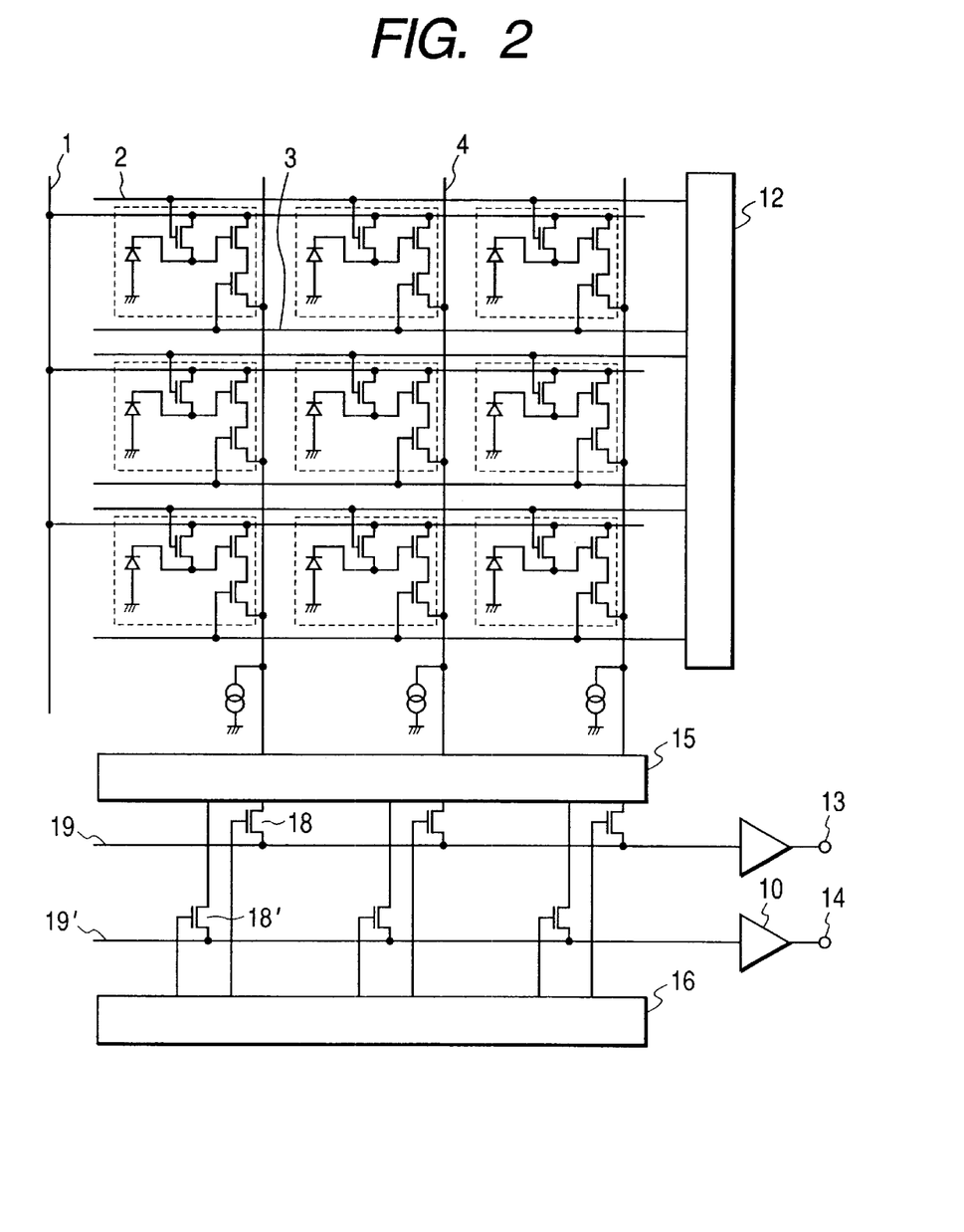
FIG. 2 is an equivalent circuit diagram including a conventional read system.

FIGS. 1A and 1B are equivalent circuit diagrams, respectively, showing the pixel portions of conventional two-dimensional solid-state image sensing apparatuses. In FIGS. 1A and 1B, the circuits respectively comprise power supply lines 1, reset switch lines 2, selection switch lines 3, signal output lines 4, and photodiodes 5. The circuit in FIG. 1A also includes a transfer switch line 6. FIG. 1A shows the circuit of the solid-state image sensing apparatus reported by Eric R. Fossum et al., IEDM, 1993 (technical reference 1: IEDM 93, pp. 583–586). FIG. 1B shows the circuit of the solid-state image sensing apparatus reported in "ISSCC96/Session 1/Plenary Session/Paper TA1.2". FIG. 2 shows an example of the circuit in FIG. 1B in which pixels are two-dimensionally laid out, and a read circuit for reading out an image signal is added.

Such a two-dimensional solid-state image sensor including a signal amplifier within each pixel requires a plurality of switch elements and a plurality of elements constituting the signal amplifier in addition to the photodiode. In FIG. 1A, one pixel requires one photodiode and four MOS transistors, inevitably increasing the size of one pixel.

The basic operation of the circuit in FIGS. 1A and 2 will be described.

(1) A reset operation of inputting the reset voltage to the input node of a source follower Q3 is performed by a reset switch Q2, and a row is selected by a selection switch Q4.

(2) The input node of the source follower Q3 is floated. A noise component made up of reset noise and fixed pattern noise such as variations in threshold voltage of the MOS source follower Q3 is read out, and the readout information is temporarily held in a signal accumulator 15.

(3) A transfer switch Q1 is opened/closed to transfer an accumulation charge generated by an optical signal to the input node of the source follower Q3. The sum of the noise component and the optical signal component is read out and held in the signal accumulator 15.

(4) The signal of the noise component and the signal of the noise and optical signal components are respectively read out to common signal lines 19 and 19' via common signal line transfer switches 18 and 18'. Outputs from the common signal lines 19 and 19' respectively yield outputs 13 and 14 via buffer amplifiers. In the next stage, the reset noise and the fixed pattern noise can be removed by calculating the difference between the outputs 13 and 14. Note that pixels are sequentially scanned by a vertical shift register 12 and a horizontal shift register 16.

To the contrary, in FIG. 1B, one pixel requires one photodiode and three MOS transistors. The number of transistors is smaller by one than in FIG. 1A, and the transfer switch line can be eliminated. This significantly reduces the pixel size.

However, owing to the absence of the transfer switch, the pixel of FIG. 1B does not comprise the mechanism of holding the noise component of each pixel during the accumulation period. Accordingly, noise cannot be removed, and the signal component-to-noise component ratio, i.e., S/N ratio of the image sensing apparatus is lower than in FIG. 1A.

As described above, in the prior arts, it is difficult to realize a high S/N ratio and reduce the pixel size. In addition, the dynamic range narrows upon voltage drop of the selection switch Q4.

SUMMARY OF THE INVENTION

It is an object of the present invention to reduce the size of a pixel or cell.

It is another object of the present invention to prevent a decrease in dynamic range of the pixel.

To achieve the above objects, according to an embodiment of the present invention, there is provided an image sensing apparatus comprising a plurality of pixels each including photoelectric conversion means, amplification means for amplifying a signal from the photoelectric conversion means, transfer means for transferring the signal from the photoelectric conversion means to the amplification means, and read control means for controlling a read of the signal from the amplification means under control of a voltage level of an input portion of the amplification means.

According to another embodiment, there is provided a signal detection apparatus comprising a plurality of cells each including detection means, amplification means for amplifying a signal from the detection means, transfer means for transferring the signal from the detection means to the amplification means, and read control means for controlling a read of the signal from the amplification means under control of a voltage level of an input portion of the amplification means.

According to still another embodiment, there is provided a signal accumulation apparatus comprising a plurality of cells each including accumulation means, amplification means for amplifying a signal from the accumulation means, transfer means for transferring the signal from the detection means to the accumulation means, and read control means for controlling a read of the signal from the amplification means under control of a voltage level of an input portion of the amplification means.

With the above arrangement, the size of the pixel or cell can be reduced.

The pixel can attain a wide dynamic range.

Other objects and features of the present invention will be apparent from the following description in conjunction with the accompanying drawings.

DESCRIPTION OF THE PREFERRED EMBODIMENTS

The portions common to the first to ninth embodiments will be first described.

Figure 3A:
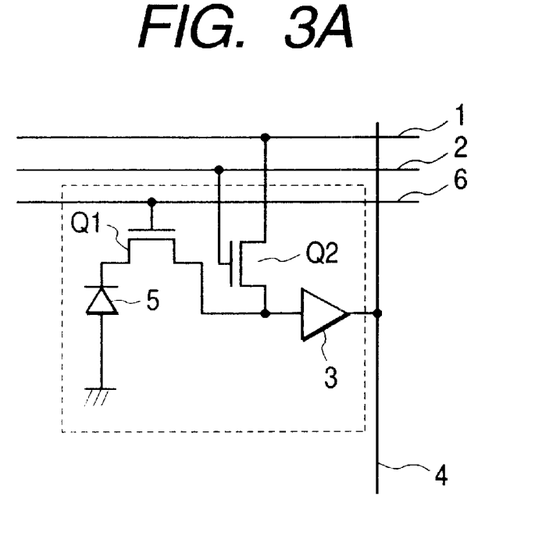
FIGS. 3A and 3B are equivalent circuit diagrams of one pixel and one pixel column according to the first embodiment of the present invention, respectively.
Figure 3B:
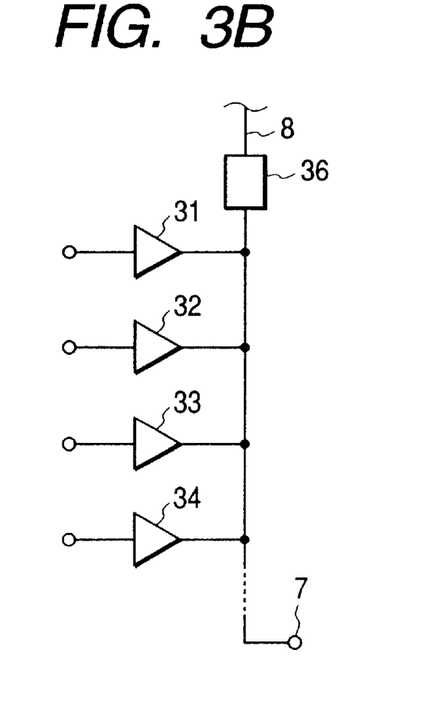

FIG. 3A is an equivalent circuit diagram of one pixel best showing the feature of the present invention. FIG. 3B is a circuit diagram for explaining an example of a read according to the present invention. The principle of the present invention will be explained with reference to FIGS. 3A and 3B.

In FIG. 3A, a charge generated by light is accumulated in a photodiode 5. A predetermined voltage is input to the input terminal of a signal amplifier 3 by a transistor Q2. This operation will be referred to as a reset operation hereinafter. A transfer switch Q1 is opened/closed to transfer the signal charge to the input terminal of the signal amplifier 3. As a means for transferring the signal charge, the photodiode 5 and the input terminal of the signal amplifier 3 may be directly electrically connected by the transfer switch Q1. They may be connected by not only one connection transistor but a plurality of transistors. The charge transfer means may be constituted by at least one charge-coupled shift register. In other words, the present invention is not limited to the charge transfer means as far as signal information can be transferred to the input terminal of the signal amplifier 3 by any means.

At this time, a noise component can be removed by holding an output signal from the signal amplifier 3 immediately after the reset operation and subtracting it from an output from the signal amplifier 3 after transfer of the signal charge. Particularly when the photodiode 5 is a buried photodiode, various random noise generated upon the reset operation can be removed by designing the photodiode 5 such that the number of residual charges becomes, e.g., about 0 to 10 electrons after the accumulation region of the photodiode 5 is sufficiently depleted upon transfer of the signal charge.

FIG. 3B is a circuit diagram showing the state wherein signal amplifiers 31 to 34 for respective pixels on a given column within pixels arranged two-dimensionally are connected to a common signal output line 7. The signal amplifier 3 basically includes the input of a multi-input signal amplifier device, and has a load 36 connected to a power supply 8. As this load, a constant current source grounded at a reference potential point may be used in order to operate the signal amplifiers 31 to 34 in a source follower scheme. However, the signal amplifier 3 may be made up of one element or two or more elements in accordance with the purpose. In the present invention, it is important that the signal amplifier device constituted by the signal amplifier 3 is a multi-input signal amplifier circuit 3 represented by a comparator circuit or adder circuit. The load 36 of the signal amplifier 3 in FIG. 3B depends on the operation scheme of the signal amplifier device constituted by the signal amplifier 3. For example, if the signal amplifier device is a follower amplifier represented by the embodiment (to be described later), the load 36 is a constant current source, and the power supply 8 is grounded. If the signal amplifier device is an inverting amplifier using a resistor load represented by the second embodiment (to be described later), the load 36 for the signal amplifiers 31 to 34 is a resistor, and the power supply 8 is a power supply voltage VDD.

The operation principle will be described. For example, in a follower type signal amplifier device represented by the first embodiment, an output from the signal amplifier device is an output from a row exhibiting the highest voltage output in the absence of a row selection switch. In a pixel arrangement in which the output decreases as the optical signal increases, the optical signal cannot be read out from a target row, and the dark level of any row is undesirably output. As a means for preventing this, the conventional arrangement employs a selection switch. To the contrary, in the present invention, when the optical signal is to be read out, a voltage for turning off the source follower transistor is input to the input terminal of a signal amplifier on a row not subjected to a read, and a voltage for turning on the transistor is input to the input terminal of a signal amplifier on a row subjected to a read. Then, only the read row is activated, and an output from the row receiving the ON voltage appears at the output terminal 7 of the signal amplifier. The following method enables reading out a signal from which even random noise can be removed.

Although "the voltage for turning off the transistor" is input, the transistor need not be fully turned off for the purpose of only selection of a read row. For example, when the power supply voltage is 5.0 V, and an ON voltage of 5.0 V is input in selecting a read row, the input transistor is not fully turned off upon application of 2 V to a nonselected row. When the input voltage of a selected row is 2 V or more, the signal of the selected row is output to the output terminal 7 of the signal amplifier. When the input voltage of the selected row is 2 V or less, a signal corresponding to an input voltage of 2 V is output to the output terminal 7 of the signal amplifier. This method can also limit the saturation output voltage.

The read method will be exemplified. In the following examples, even random noise generated upon the reset operation can also be removed.

(1) The OFF voltage is input via the transistor Q2 upon a signal read.

(2) The ON voltage is input via the transistor Q2 to the input terminal which has been at the OFF voltage, in order to read out a signal from a selected row.

As a result, the signal amplifier 3 on the selected row is activated.

Figure 17:
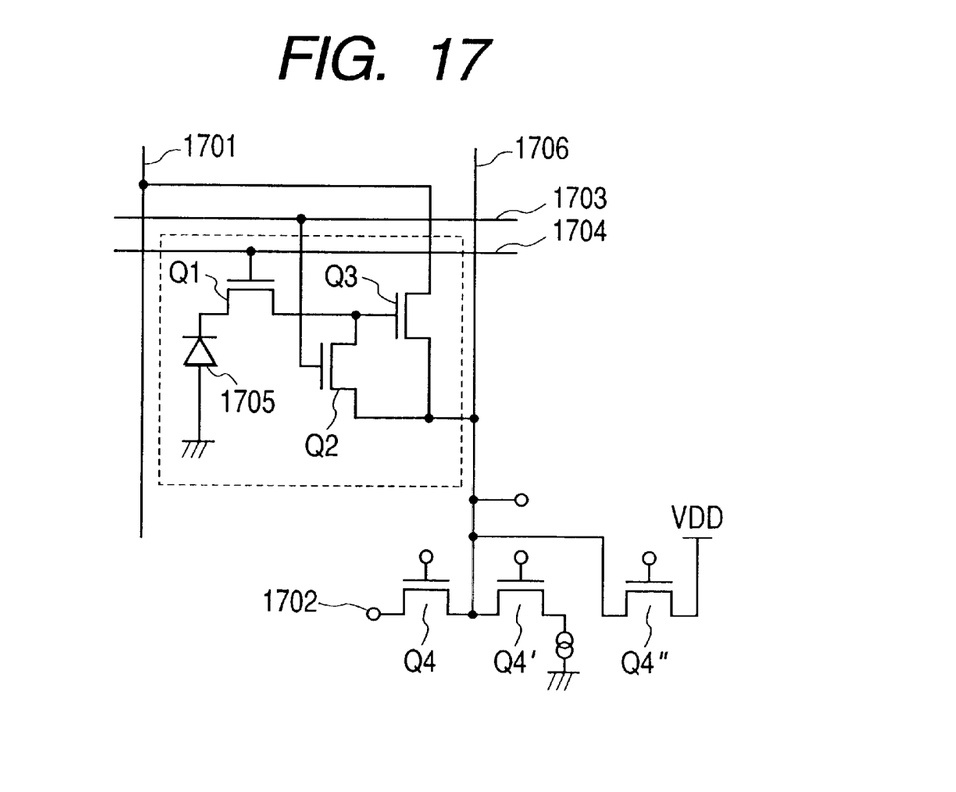
FIG. 17 is a simple equivalent circuit diagram including a read system according to the ninth embodiment of the present invention.

(3) The transistor Q2 is turned off, and the output from the signal amplifier device that are made of fixed pattern noise and random noise at the input terminal is held at a portion corresponding to the signal accumulator 15 in FIG. 17.

(4) The transfer switch Q1 is opened/closed to transfer the signal charge accumulated in the photodiode 5 to the input terminal of the signal amplifier 3.

(5) The output from the signal amplifier device that is obtained by adding the signal charge to the noise signal in (3) is held at the portion corresponding to the signal accumulator 15 in FIG. 17.

(6) After the signal is read out, the OFF voltage is input to the input terminal of the signal amplifier 3 via the transistor Q2 to inactivate the signal amplifier 3 on the row.

(7) The output signal made of the noise signal in (3) is subtracted from the output signal made of the noise signal and the signal charge in (5) that is held by the signal accumulator 15.

The subtraction can be executed using a differential circuit with an operational amplifier and a capacitive clamp circuit.

By the steps (1) to (7), the noise signal can be removed to realize an image sensing apparatus having a high S/N ratio.

As another read method, e.g., the order of reading out the noise signal may be changed. That is, after the output signal made of the noise signal and the signal charge is read out, the reset operation is performed, and the output signal made of the noise signal is read out and subtracted from the output signal made of the noise signal and the signal charge. In this case, random noise generated upon the reset operation cannot be removed, but fixed pattern noise of the signal amplifier can be removed.

In this manner, the present invention does not require the conventional selection switch for outputting the pixel signal to the signal output line. Consequently, the number of elements decreases, which greatly reduces the pixel size.

In the image sensing apparatus, the signal amplifier must have linearity and a dynamic range. If, however, the selection switch exists, the linearity is degraded by the resistance component of the selection switch. For example, as shown in FIG. 1A, when the selection switch Q4 made of a MOS transistor is inserted, a sufficient gate-source voltage VGS is applied to the selection switch Q4 in the region where the gate voltage of the MOS source follower Q3 is low. Therefore, the current of the constant current source can flow at a low drain-source voltage VDS, and a voltage drop at the selection switch Q4 can be ignored. To the contrary, in the region where the gate voltage of the MOS source follower Q3 is high, the VGS of the selection switch Q4 is low, and thus high VDS is required. The voltage drop at the selection switch Q4 quadratically increases, which greatly degrades the linearity. At the same time, the output voltage also decreases, which narrows the dynamic range.

To prevent degradation of the linearity, the selection switch Q4 may be arranged on the VDD side of the MOS source follower Q3. Even in this case, the VGS of the selection switch Q4 cannot be ensured, and the voltage drop at the selection switch Q4 increases, which narrows the dynamic range.

A voltage drop V is qualitatively given by $$V = \sqrt{I_{const}/\beta} + V_{th}$$

Iconst: the current value of the constant current source serving as the load of the source follower Q3

Vth: the threshold voltage of the MOS selection switch Q4 including the substrate bias effect β: the structure parameter representing the driving force of the selection switch Q4

In this case, since the oxide film capacitance of the MOS Q3 corresponding to all the rows is added to the signal output line 4, the load capacitance is large, and a high-speed operation is difficult to perform.

To perform a high-speed operation, Iconst must be set large. For large Iconst, the voltage drop at the selection switch Q4 becomes undesirably large, as represented by the above equation.

However, if the OFF voltage is input to the MOS transistor constituting the MOS source follower Q3 on a non-selected row, no oxide film capacitance is added. Accordingly, an image sensing apparatus having a wide dynamic range because of the absence of the selection switch Q4 can be provided.

The present invention is not limited to an image sensing apparatus for reading out the optical signal, and can be applied to a magnetic detection apparatus in which cells are constituted using a magnetic sensor as a signal detection element instead of the photodiode in the pixel described above, and are two-dimensionally arranged.

The present invention can also be applied to an analog memory in which cells are constituted using a holding capacitor instead of the photodiode 5 in FIG. 3A. In this analog memory, e.g., analog data is applied to a reset power supply line and written in the holding capacitor via Q2 and Q1. The analog data written in the holding capacitor is read out by the same procedure as that of reading the optical signal. For example, the analog memory is designed to write 256 gray levels, i.e., 8-bit digital data as one analog data in one cell, and constituted by 1,000,000 cells. As a result, an 8-Mbit analog memory can be provided.

In the above-described arrangement, the signal amplifier is constituted by a MOS transistor which operates in a source follower scheme, and a MOS transistor which reversely amplifies the resistor load, with a small area and a simple arrangement under the control of the semiconductor process.

The first to ninth embodiments will be explained in more detail based on the above description.

Figure 4:
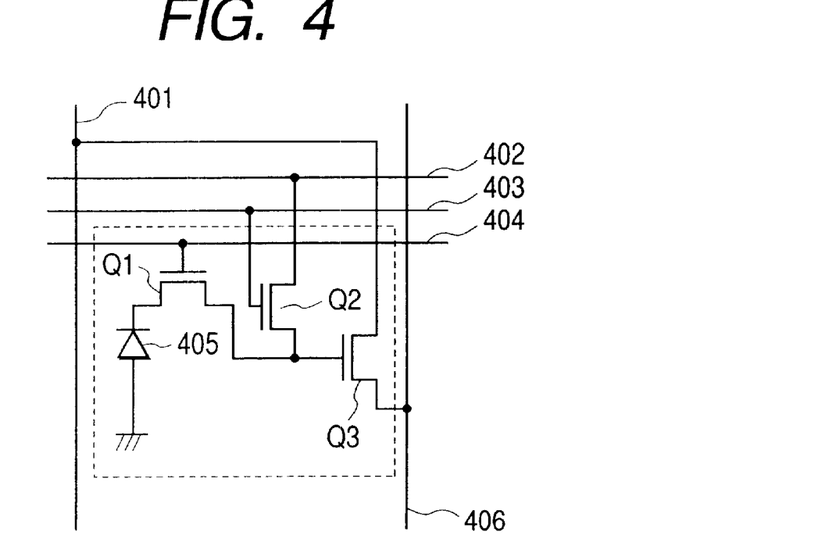
FIG. 4 is an equivalent circuit diagram of one pixel according to the first embodiment of the present invention.
Figure 5:
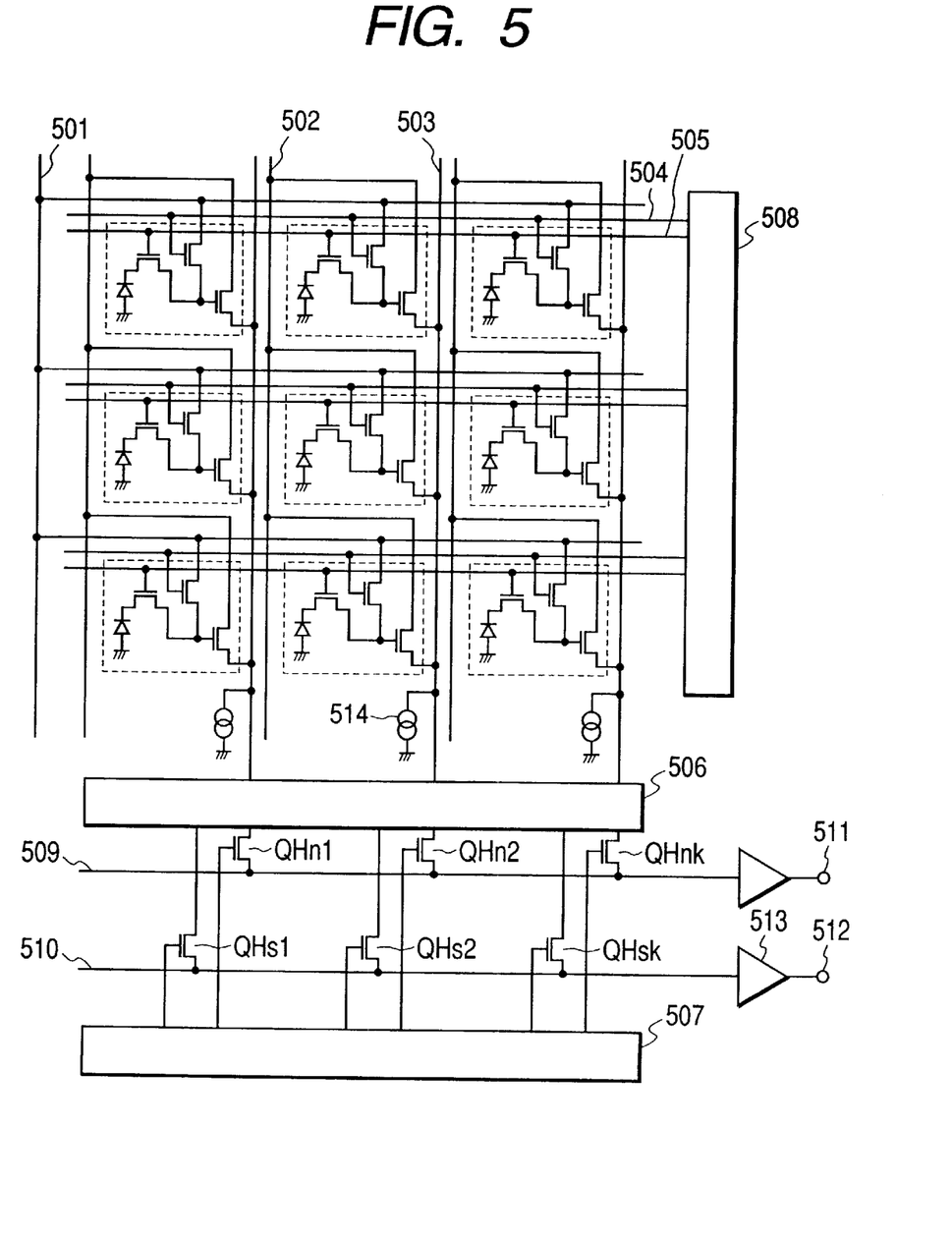
FIG. 5 is an equivalent circuit diagram including a read system according to the first embodiment of the present invention.
Figure 6:
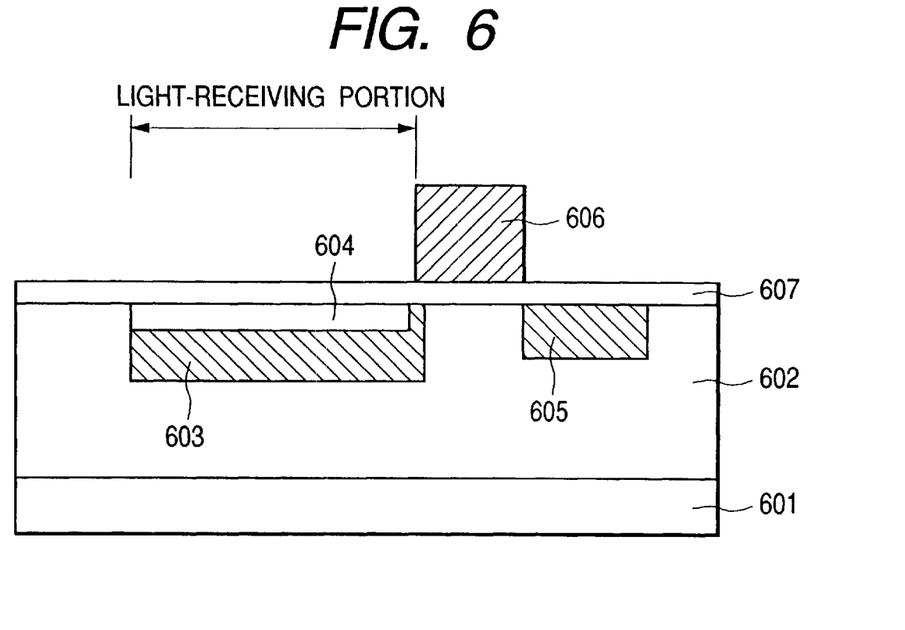
FIG. 6 is a sectional view of a photodiode and a signal transfer unit used in the present invention.

FIG. 4 is an equivalent circuit diagram of the pixel portion of the first embodiment. FIG. 5 is a circuit diagram for explaining the first embodiment also including a read system. The photodiode in the first embodiment is a buried photodiode like the one shown in FIG. 6. The buried photodiode serving as a light-receiving portion is formed from an n-type layer 603 formed in a p-type well region 602 on an n-type silicon substrate 601. A p-type surface layer 604 formed on the n-type layer 603 is a dark current prevention surface layer. An insulating layer 607 is formed between the p-type well region 602 and a gate electrode 606. The gate electrode 606 in FIG. 6 serves as the gate electrode of a transfer switch Q1 in FIG. 4, and an $n^+$-type region 605 is connected to the gate electrode of a source follower Q3 in FIG. 4. One terminal of the source follower Q3 in FIG. 4 is connected to a signal output line 503 in FIG. 5. The source follower Q3 is connected to a constant current source 514 via the signal output line 503 to form a source follower and amplify the signal. In FIG. 4, the transfer switch Q1 is a switch for transferring a charge accumulated in a photodiode 405 to the gate of the source follower Q3 serving as the input terminal of the signal amplifier. In FIG. 4, a reset switch Q2 is a switch for inputting the voltage set in a reset power supply 402 to the input terminal. In FIG. 5, signals are read out in units of rows. As described above, a noise signal is first read out and held in a signal accumulator 506 constituted by noise and optical signal capacitors arranged for each element. An optical signal is read out and hold in the signal accumulator 506. After the noise signal and the optical signal are read out to the signal accumulator 506, the noise and optical signals held in the signal accumulator 506 are sequentially read out to a common signal line 1 (509) and a common signal line 2 (510) in a time-series manner by opening/closing switches QHnk and QHsk by a horizontal shift register, and externally output as a noise signal 511 and an optical signal 512 via an output amplifier 513. The noise signal (=the noise component) is subtracted from the optical signal (=the optical component+the noise component) using two types of circuits, i.e., a clamp circuit and a differential circuit. As a result, the signal can be read out without arranging any row selection pixel switch in the pixel, and the pixel size can be reduced without forming any selection switch opening. In addition, the S/N ratio equal to that of the conventional apparatus can be obtained.

Figure 8:
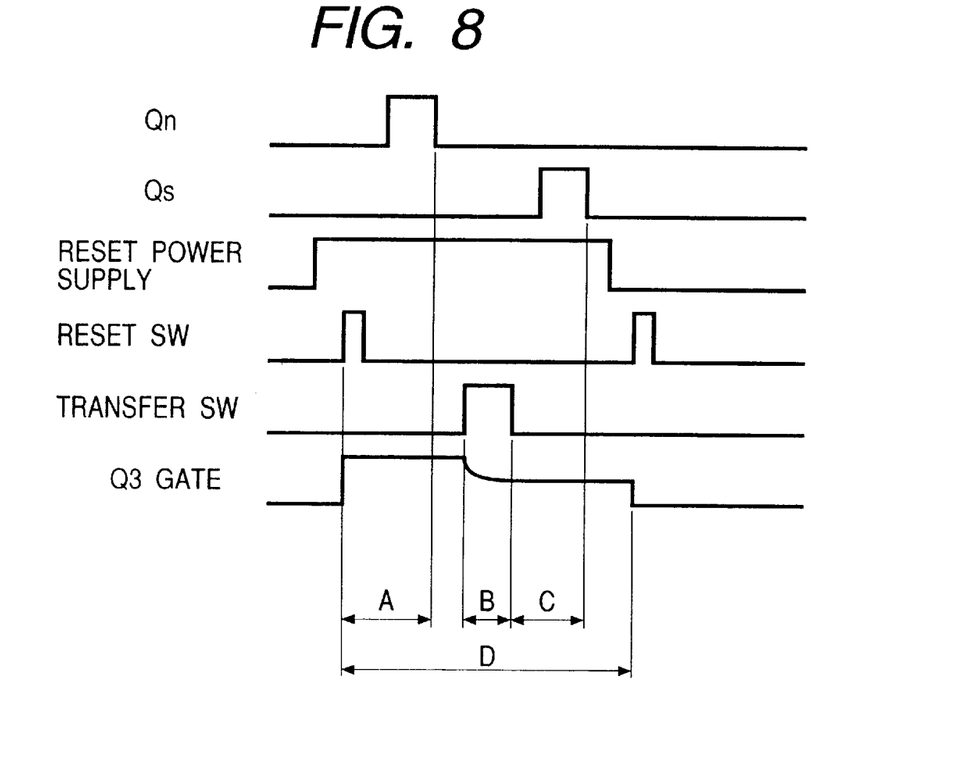
FIG. 8 is a timing chart of a pulse to a pixel transistor used in the first and third embodiments of the present invention.

FIG. 8 shows the pulse timing to each pixel transistor used in the first embodiment, i.e., the period between reads of the noise and optical signals from the pixel to the signal accumulator 506.

Qn and Qs in FIG. 8 are write switching timings to the signal accumulator 506.

Figure 7:
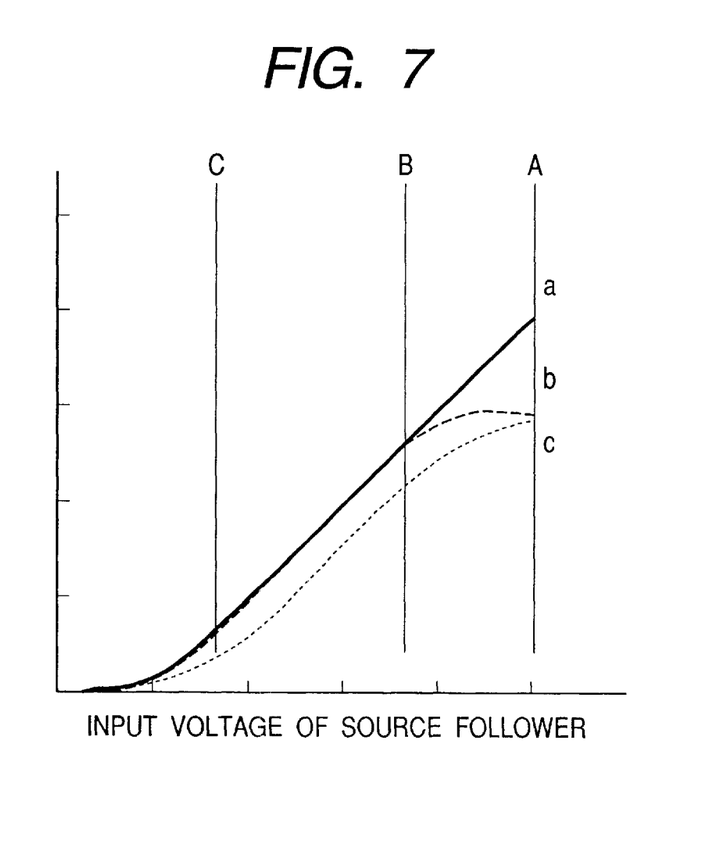
FIG. 7 is a graph of the characteristics of a signal amplifier according to the first embodiment of the present invention.

FIG. 7 shows the input/output characteristics of the source follower used as the signal amplifier. A curve a represents the input/output characteristics of the first embodiment, and an input voltage A is the highest input voltage. An input voltage C of the source follower is the lowest input voltage at which the linear region is ensured, and set to be a voltage upon reading out the highest signal charge. A curve b represents characteristics obtained when the dynamic range is narrow due to saturation at an input voltage B. A curve c represents characteristics obtained when the source follower has a large loss and an absolutely small gain.

A period D in FIG. 8 is a pixel selection period. The row was confirmed to be selected or not to be selected by inputting a voltage equal to or higher than the input voltage C to the input terminal of the source follower Q3 on a selected row by the reset operation, and inputting a voltage less than the input voltage C to a nonselected row.

The operation will be described with reference to FIG. 8. After the reset power supply is changed to high level, the reset switch Q2 on a row to be selected is turned on to change the gate voltage of the source follower Q3 to high level. The gate voltage is equal to the reset power supply if the gate voltage of the reset switch Q2 is much higher than the voltage of the reset power supply, or is lower by the threshold voltage than the gate voltage of the reset switch Q2 if the gate voltage of the reset switch Q2 is equal to or lower than the voltage of the reset power supply.

After the reset switch Q2 is turned off, and the gate of the source follower Q3 is floated, Qn of a transfer switch QHn to the common signal line 509 is turned on, and a noise component immediately after the reset operation is held in the signal accumulator 506 (interval A in FIG. 8).

Since only the gate voltage of the source follower Q3 on a selected row is much higher than the gate voltage of the source follower Q3 on a nonselected row, the current from the constant current source arranged on a signal output line on each column flows through only the source follower Q3 on the selected row, and the voltage corresponding to the gate voltage of the source follower Q3 on the selected row is output from the source follower.

After Qn is turned off, the transfer switch Q1 is turned on to transfer the optical signal component from the photodiode 405 to the gate of the source follower Q3 (interval B in FIG. 8). A voltage drop $Qsig/C_{Q3}$ corresponding to a transferred charge Qsig and a capacitor $C_{Q3}$ at the gate terminal of the source follower Q3 occurs. When the reset switch Q2 is turned off, the gate of the source follower Q3 holds the voltage obtained by superposing the optical signal component on the noise component. The voltage corresponding to this gate voltage of the source follower Q3 is output from the source follower.

At the gate of the source follower Q3, the voltage becomes lowest upon a read of the saturation charge. In the selective read method of the present invention using the gate operating point of the source follower Q3, it is important that the voltage is much higher than the gate voltage of the source follower Q3 on the nonselected row.

Qs of a transfer switch QHs to the common signal line 510 is turned on/off, and a signal obtained by reading out the optical signal component onto the noise component is held in the signal accumulator 506 (interval C in FIG. 8).

After the voltage of the reset power supply is changed to low level, the reset switch Q2 is turned on/off to decrease the gate voltage of the source follower Q3 and cancel selection of the source follower Q3.

The dynamic range will be explained with reference to FIG. 7. To confirm the effectiveness of the present invention, the results of row selection by the conventional selection switch Q4 are also shown in FIG. 7. The curves a, b, and c respectively represent characteristics for the pixel of the present invention, i.e., the pixel when the selection switch Q4 is inserted between the input MOS transistor Q3 and the power supply, and the conventional pixel shown in FIG. 1A. In the first embodiment, a high source follower input voltage is applied to the dark side, and the input terminal reset voltage is applied to the power supply side by the reset switch Q2. As optical charges increase, the input voltage to the source follower drops. In general, linear characteristics on the dark side are important, so that linearity must be ensured in the region where the input voltage is high. The linearity could be ensured up to the voltage A in FIG. 7 in the pixel of the present invention, but to only the voltage B in FIG. 7 in the conventional pixel. From these results, the pixel of the present invention was confirmed to have a wide dynamic range. Particularly in the region where the power supply voltage is low, this effect becomes more prominent, and the lowest operable power supply voltage is lower by about 1 V than in the conventional pixel of FIG. 1A.

Figure 9:
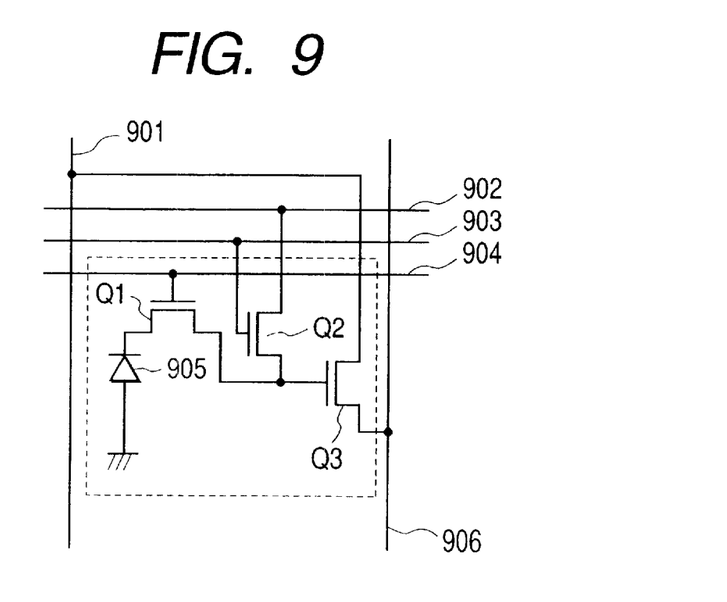
FIG. 9 is an equivalent circuit diagram of one pixel according to the second embodiment of the present invention.
Figure 10:
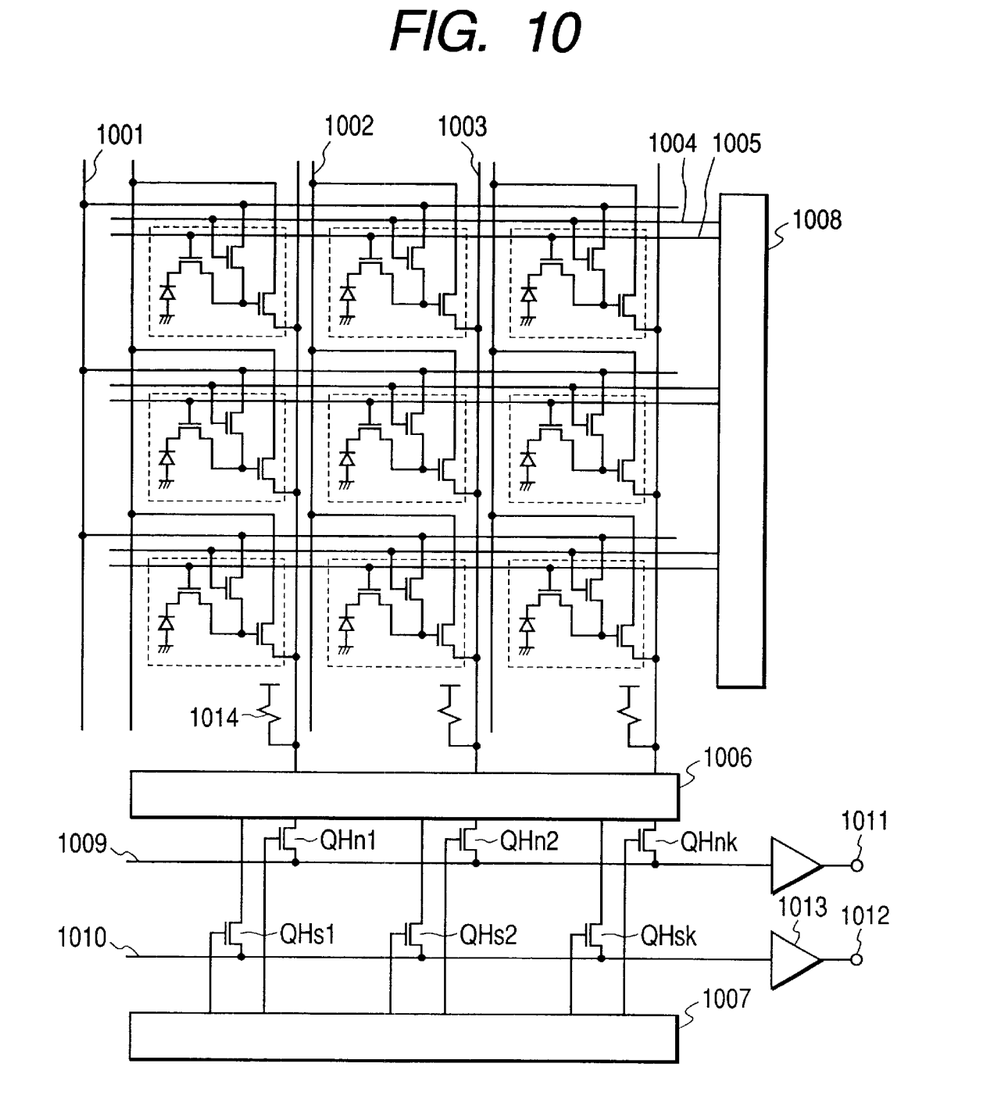
FIG. 10 is an equivalent circuit diagram including a read system according to the second embodiment of the present invention.

FIG. 9 is an equivalent circuit diagram of the pixel portion of the second embodiment. FIG. 10 is a circuit diagram for explaining the second embodiment also including a read system. A photodiode 905 in the second embodiment is a buried photodiode, similar to the first embodiment.

The signal amplifier is constituted by an inverting amplifier made up of a MOS transistor Q3 and a load resistor 1014, and the read procedure and the pulse timing to each pixel transistor are the same as in the first embodiment.

More specifically, a voltage equal to or less than the threshold voltage of the MOS transistor Q3 is input to the gate terminal of the MOS transistor Q3 on a nonselected row to turn off the MOS transistor Q3. The gate terminal of the MOS transistor Q3 on a selected row is temporarily reset to high level, and an optical signal is read out to the gate terminal of the MOS transistor Q3 to flow a current corresponding to the voltage of the gate terminal of the MOS transistor Q3 on the selected row through the load resistor 1014, and to selectively read out the optical signal. The read timings of the optical signal and the noise signal are the same as in the first embodiment. The reset power supply voltage applied from a reset switch Q2 is the same as in the first embodiment in order to ensure a wide dynamic range.

Since the signal amplifier is an inverting amplifier, the gain at the signal amplifier can be designed in a circuit, and a sensor having a higher S/N ratio than that of the source follower amplifier in the first embodiment can be provided.

The third embodiment provides an optical sensor constituted by an inverting amplifier made up of a p-channel junction field effect transistor shown in FIG. 2 as a transistor Q3 constituting the signal amplifier, and a load resistor.

Since the gate electrode of the junction field effect transistor Q3 is formed from an impurity diffusion region, the diffusion region as the source/drain region of a transfer switch Q1 is directly used as the gate electrode. As a result, the pixel size can be reduced because of the absence of the region for connecting the diffusion region as the source/drain region of the transfer switch Q1 and the polysilicon gate electrode of the junction field effect transistor Q3 in the first and second embodiments, i.e., the absence of the contact portion for connecting the diffusion region and an aluminum metal interconnection, the contact portion for connecting polysilicon and a metal interconnection, and the interconnection portion for connecting the metal interconnections to each other.

The third embodiment adopts the p-channel junction field effect transistor Q3. For the nonselected row, a high-level OFF voltage is input. For the selected row, the voltage is temporarily reset to an ON voltage of about (½)*VDD, and then the optical signal is transferred to the control electrode of the junction field effect transistor. After the optical signal is transferred to the control electrode, the voltage of the control electrode drops. Since both the voltage of the control electrode and the power supply voltage can be decreased, the optical sensor can operate at a low power supply voltage without narrowing the dynamic range.

Figure 11:
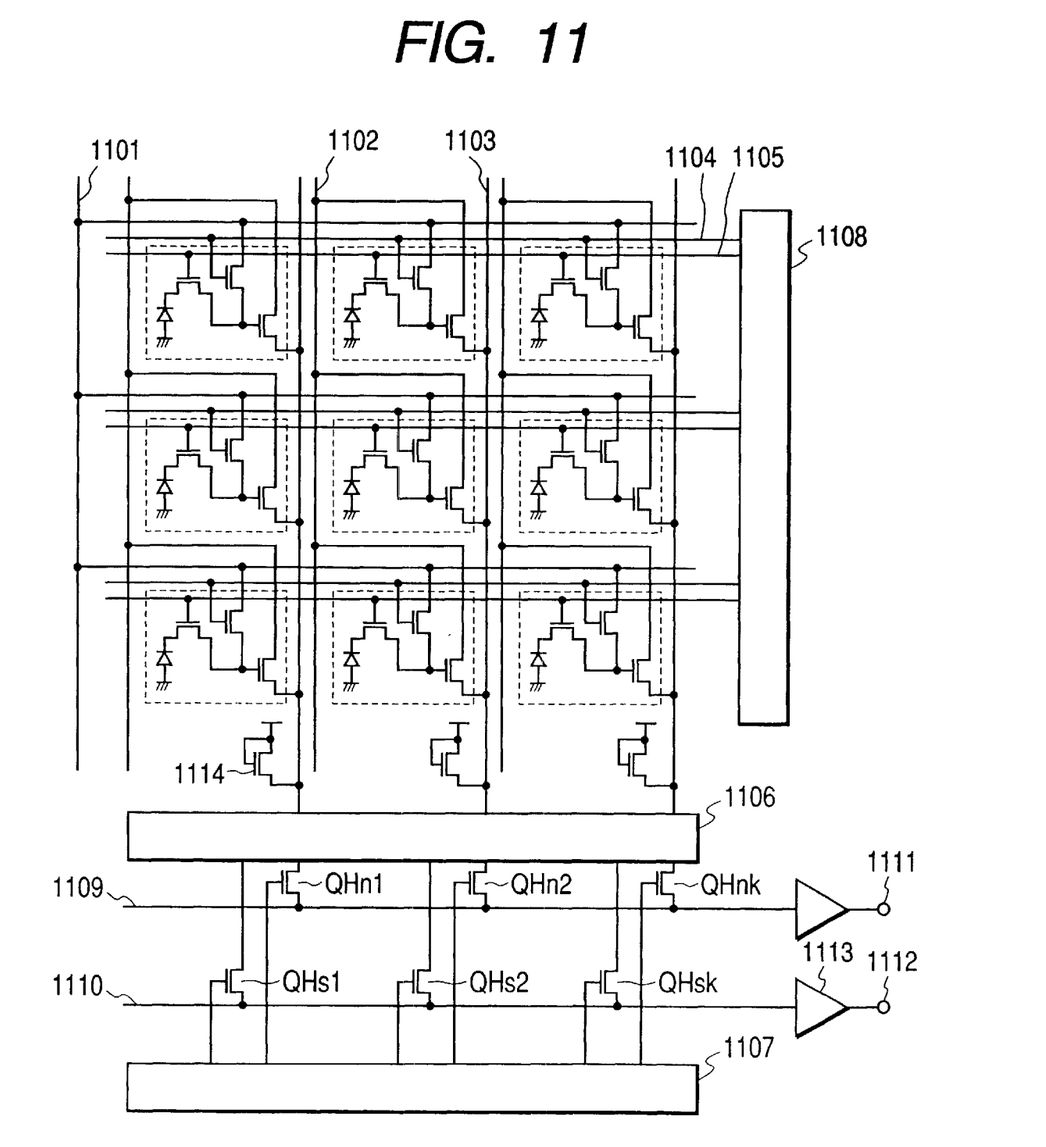
FIG. 11 is an equivalent circuit diagram including a read system according to the fourth embodiment of the present invention.

FIG. 11 is an equivalent circuit diagram of the fourth embodiment. In the fourth embodiment, a MOS transistor 1114 replaces the load resistor 1014 of the signal amplifier in the second embodiment.

In the second embodiment, letting Vin be the input voltage of the signal amplifier, and Vout be the output voltage to a signal output line 1003, $$Vout=R*A*(Vin-B)^2$$

where R is the resistance value of the resistor load 1014, and A and B are parameters unique to the MOS transistor Q3.

In the fourth embodiment, letting Vin be the input voltage of the signal amplifier, and Vout be the output voltage to a signal output line 1103, $$Vout=A*(Vin-B)$$

where A and B are parameters unique to the MOS transistor Q3 and the MOS load 1114.

In the above manner, the output voltage Vout can be given as a linear function of the input voltage Vin, and A>1 can be satisfied. In this case, the linear region of the source follower Q3 of the signal amplifier can be widened.

Figure 12:
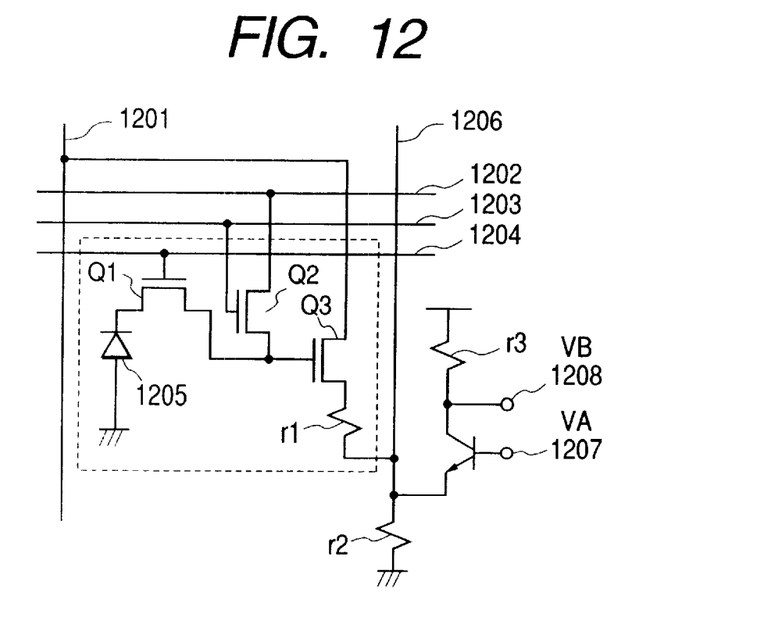
FIG. 12 is a simple equivalent circuit diagram including a read system according to the fifth embodiment of the present invention.

FIG. 12 shows a read circuit of the fifth embodiment. The source terminals of a plurality of pixel MOS transistors Q3 are connected to a signal output line 1206, similar to the above embodiments. The read procedure and the pulse timing to each pixel transistor are the same as in the first embodiment.

According to the operation principle, when a constant voltage VA is applied to a VA terminal 1207, the emitter voltage of a bipolar transistor, i.e., the voltage of the signal output line 1206 is fixed to [VA−VBE] for a base-emitter voltage VBE of the bipolar transistor.

When a reset voltage Vres is input to the gate terminal of the MOS transistor Q3, the MOS transistor Q3 flows a current I1:

$$I1=\{(Vres-Vth)-(VA-VBE)\}/r1$$

Since a current I2 flows via a resistor r2:

$$I2=(VA-VBE)/r2$$

a current I3 (=I2−I1) flows via a resistor r3 connected between the power supply and the bipolar transistor:

$$[(VA-VBE)/r2]-\{(Vres-Vth)-(VA-VBE)\}/r1$$

and a terminal VB 1208 receives a voltage VB:

$$VDD-([(VA-VBE)*r3/r2]-[\{(Vres-Vth)-(VA-VBE)\}*r3/r1])$$

When the optical signal is transferred to the gate terminal of the MOS transistor Q3, and the voltage of the gate terminal of the MOS transistor Q3 changes to $$Vres-\Delta V$$

the voltage VB of the terminal VB 1208 changes to $$VDD-([(VA-VBE)*r3/r2]-[(\{Vres-\Delta V-Vth)-(VA-VBE)\}*r3/r1])$$

An optical signal component $\Delta V*r3/r1$ can be obtained by calculating the difference between the voltage VB of the terminal VB 1208 immediately after the reset operation and the voltage VB of the terminal VB 1208 after transfer of the optical signal to the gate terminal of the MOS transistor Q3.

In the fifth embodiment, the pulse shown in FIG. 8 is simultaneously applied to a plurality of rows to simultaneously select them. The above subtraction is performed to obtain the sum of pixel signals at the terminal VB. In the third and fourth embodiments, the sum can also be obtained, but no linear sum can be obtained. More specifically, the sum of pixel signals in the same row and the same color of two rows is output to the terminal VB. When the selection switch exists as in the conventional arrangement, addition cannot be performed with high precision due to the presence of a nonlinear switch resistance. However, since the present invention does not require any selection switch, addition can be easily performed with high precision.

Figure 13:
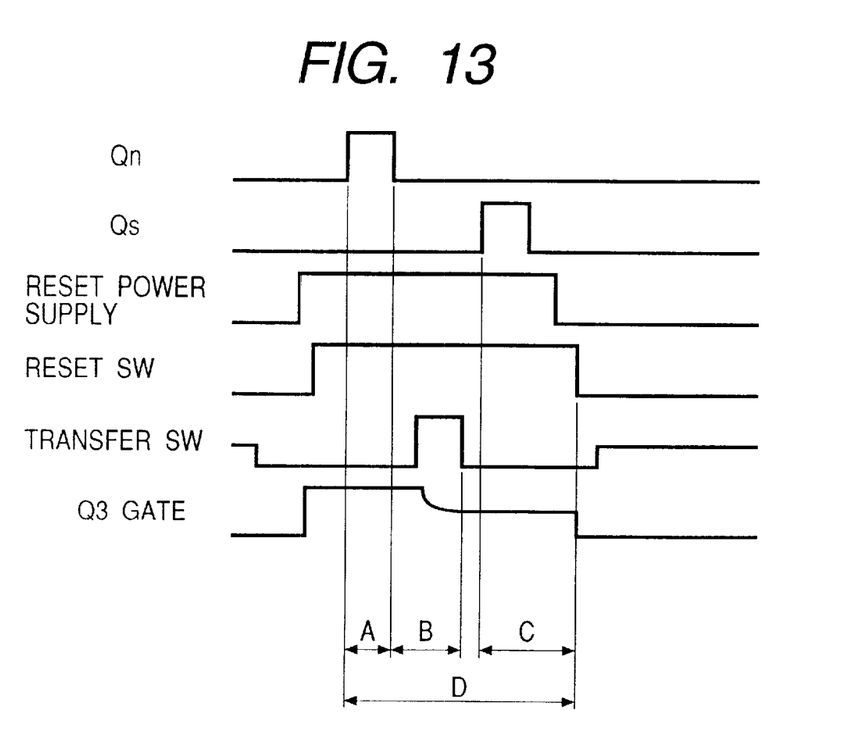
FIG. 13 is a timing chart of a pulse to a pixel transistor used in the sixth embodiment of the present invention.

In the circuit arrangement of the first embodiment, a pulse is applied to each pixel transistor at a corresponding timings shown in FIG. 13. In the sixth embodiment, during the nonselection period, the reset switch is kept on, and the voltage of the reset power supply is continuously applied via a reset switch Q2. A transfer switch Q1 is set at a voltage between high and low levels. Consequently, the transfer switch Q1 comprises a lateral overflow drain function of determining the overflow level by the gate voltage of the transistor Q1, and crosstalk to an adjacent pixel is reduced. Since the overflow level also depends on the threshold voltage of the transistor Q1, the transistor Q1 can function as a lateral overflow drain depending on the threshold voltage of the transistor Q1 even when the gate voltage of the transistor Q1 is 0 V.

To function the transfer switch Q1 as a lateral overflow drain, the drain-side voltage is generally set to or almost to high level. In this case, as shown in FIGS. 1A and 1B, the selection switch Q4 must be arranged. The present inventors have made extensive studies to find that the transfer switch Q1 functions as a lateral overflow drain if the transistor Q1 having a source on the photodiode side and a drain as the gate terminal of a MOS transistor Q3 satisfies the bias conditions of a pentode operation. In the sixth embodiment, the gate voltage of Q1 is set lower than in the conventional arrangement, and the low level of the reset power supply is set at 1.5 V. Further, this low-level voltage limits the saturation voltage. The pulse timing to each pixel transistor in the sixth embodiment can be applied to not only the circuit arrangement in the first embodiment but to the circuit arrangements in the remaining embodiments.

Figure 14:
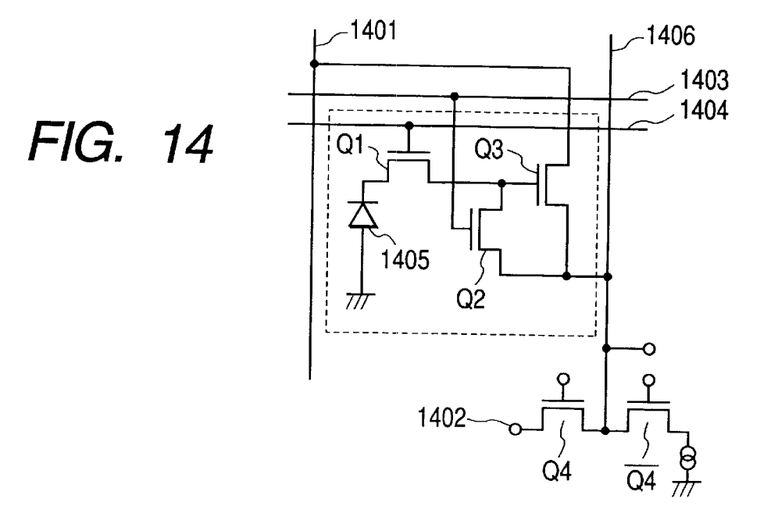
FIG. 14 is a simple equivalent circuit diagram including a read system according to the seventh embodiment of the present invention.
Figure 15:
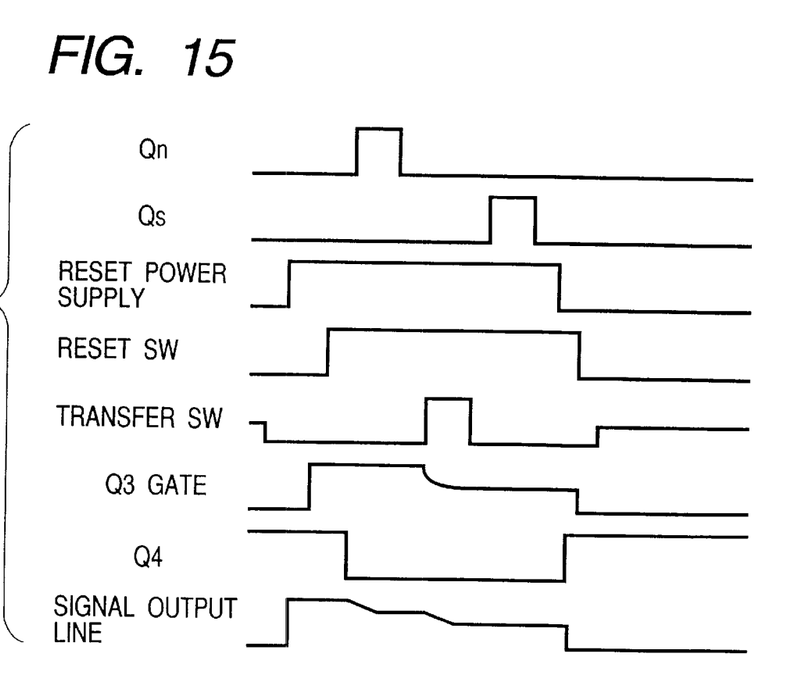
FIG. 15 is a timing chart of pulses to a pixel transistor and a main transistor used in the seventh embodiment of the present invention.

FIG. 14 shows the circuit arrangement of each pixel in the seventh embodiment. FIG. 15 is a timing chart showing the pulse timings of each pixel transistor and another main transistor, and the output voltage of a signal output line 1406. The read circuit according to the seventh embodiment is also constituted by a signal accumulator 506 and a horizontal shift register 507 shown in FIG. 5. The seventh embodiment is different from the first and sixth embodiments in that the reset voltage is applied via the signal output line 1406 without any reset power supply line. That is, the signal output line 1406 functions as the output signal line and reset power supply line of the first and sixth embodiments in a time-series manner in response to the ON/OFF state of a transistor Q4.

Similar to the first embodiment, signals from pixels are temporarily held in the signal accumulator 506, sequentially read out to a common signal line 1 (509) and a common signal line 2 (510) by sequentially opening/closing switches QHn and QHs by the horizontal shift register 507, and externally output as a noise signal 511 and an optical signal 512 via an output amplifier 513. The external read period is called a horizontal scanning period. During the horizontal scanning period, a reset switch Q6 is kept on, and the voltage of a reset power supply 1402 is continuously applied to the signal output line 1406 via the reset switch Q6 and the transistor Q4, similar to the sixth embodiment. A transfer switch Q1 is set at a voltage between high and low levels. Consequently, the transfer switch Q1 comprises a lateral overflow drain function of determining the overflow level by the gate voltage of the transistor Q1, and crosstalk to an adjacent pixel is reduced.

Compared to the sixth embodiment, the transfer switch Q1 in a pixel of a nonselected line is turned off to stop the overflow drain function every time a signal from a pixel of a selected row is transferred to the signal accumulator 506. According to the driving method of the seventh embodiment, image information is read out at an NTSC rate. That is, a signal from a pixel of a selected row is transferred to the signal accumulator 506 in a horizontal blanking period of bout 10 μsec, and information of the signal accumulator 506 is externally read out in a horizontal scanning period of about 50 μsec. The overflow drain function stop period is therefore about 17% of the whole period, and the transfer switch Q1 effectively functions as an overflow drain in most of the period.

FIG. 15 shows the timings of a pair of switches QHn and QHs, i.e., switches Qn and Qs, the reset power supply on a selected row, the reset switch Q2 for turning on/off (high/low) a reset SW connected to the reset line immediately after the reset power supply, the transfer switch Q1 for transferring the charge of the photodiode to the gate input terminal of a MOS transistor Q3 before reading out the optical signal after reading out the noise signal, the gate input voltage of the MOS transistor Q3 which changes depending on the charge corresponding to the optical signal after turning on the transfer switch Q1, the reset switch Q4 for supplying the reset power, a load switch $\overline{Q4}$ which is turned on/off inversely to the reset switch Q4 using the constant current source as the load of the MOS transistor Q3, and the signal output line showing the signal output voltage of the signal output line 1406.

Figure 16:
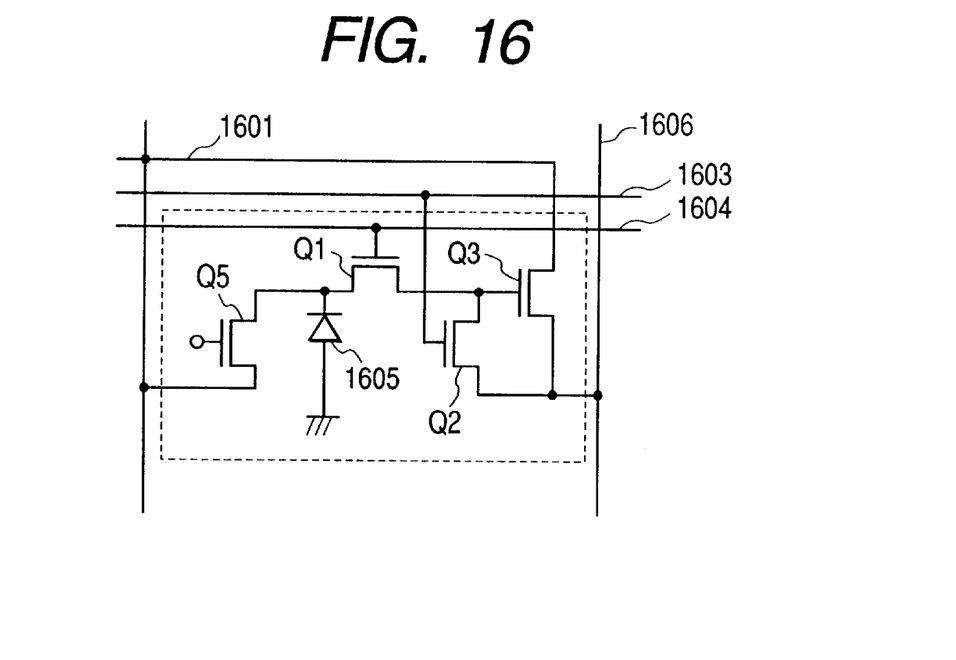
FIG. 16 is an equivalent circuit diagram of one pixel according to the eighth embodiment of the present invention.

FIG. 16 is an equivalent circuit diagram of the pixel portion of the eighth embodiment. A lateral overflow drain MOS transistor Q5 is added to the pixel arrangement of the seventh embodiment. The overflow level was examined for the case in which the level is determined by the gate voltage of the MOS transistor Q5, and the case in which the threshold voltage is adjusted to satisfy relationship of the gate voltage of the MOS transistor Q5=the drain voltage of the MOS transistor Q5=VDD. Almost the same crosstalk resistance as that in the seventh embodiment was confirmed, and the seventh embodiment was found to be an effective means. In the seventh embodiment, the lateral overflow drain by the MOS transistor Q5 is arranged, but a vertical overflow drain may be arranged.

The ninth embodiment will be described with reference to FIG. 17. In the ninth embodiment, Q4" is added to the arrangement of the seventh embodiment. During the horizontal scanning period, similar to the seventh embodiment, Q4 is turned on, Q4' and Q4" are turned off, and a transistor Q1 is made to function as a lateral overflow drain. In a read, Q4 is turned off, Q4' and Q4" are turned on, and a MOS transistor Q3 is turned on to enable selection of two types of read schemes, i.e., a source follower read scheme and an inverting amplifier read scheme.

More specifically, Q4 is turned off, Q4' is turned on, Q4" is turned off, and a power supply 1701 is set at VDD to perform a source follower read similar to the first embodiment.

On the other hand, Q4 is turned off, Q4' is turned off, Q4" is turned on, and the power supply 1701 is grounded to perform a MOS inverting amplifier read similar to the fourth embodiment. Since the transistor Q3 is symmetrical to the power supply and the signal output line because of the absence of the selection switch, excellent linearity can be obtained, and a multifunctional read can be realized by adding only a simple circuit. More specifically, a square addition read by an inverting amplifier read and bottom detection by a source follower read are performed.

In the ninth embodiment, the number of MOS transistors seems to largely increase by the read scheme selection switch made up of the reset switch Q4 for supplying the reset power supply voltage to the output signal line, the load switch Q4' serving as the load of the MOS transistor Q3 to add the load of the constant current source read out in a source follower scheme, and the power supply switch Q4" for supplying the power supply VDD. Compared to ten thousand to hundred thousand pixels, an increase in occupied area is very small. Compared to the absence of the selection switch, a large pixel opening rate can be ensured. Further, the read scheme can be selected in accordance with the read state of the optical signal from which the noise signal is removed.

As has been described above, according to the first to ninth embodiments, a read pixel can be selected or not selected by changing the operating point of the input terminal of the signal amplifier in the pixel or cell, i.e., the reset voltage of the input terminal to a predetermined voltage. The conventional read selection switch can be eliminated to attain the following effects.

The number of transistors included in the pixel or cell decreases to downsize the pixel or cell. The linearity of the signal amplifier can be ensured in a wide voltage range without any selection switch. Moreover, a multifunctional read can be performed by adding a simple circuit, e.g., a MOS transistor for temporarily resetting the signal output line and a selection switch for setting the source follower circuit and the inverting amplifier.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:
    a plurality of pixels each including a photoelectric conversion device, and an amplification device arranged to amplify a signal from said photoelectric conversion device;
    a common output line to which signals from said plurality of pixels are read out sequentially from said amplification devices;
    a load device arranged to function as a load of the amplification devices which are connected to said common output line; and
    a control circuit arranged to supply a first voltage to an input portion of a said amplification device included in a selected pixel from which a signal is selected to be read and to supply a second voltage which is greater than zero and lower than the first voltage, to the input portion of amplification devices included in the non-selected pixels from which signals are not selected to be read,
    wherein in case that a voltage of the input portion of the amplification device included in the selected pixel falls below a predetermined voltage due to a signal accumulated in said photoelectric conversion device, the signal read to said common output line appears to be based on the second voltage supplied to the input portion of the amplification device included in the non-selected pixels.

2. An apparatus according to claim 1, wherein said amplification device comprises a MOS transistor, and the input portion is a gate of the MOS transistor.

3. An apparatus according to claim 1, wherein said amplification device comprises a junction transistor.

4. An apparatus according to claim 1, wherein said amplification device is of a follower type.

5. An apparatus according to claim 1, wherein said amplification device is of an addition type.

6. An apparatus according to claim 1, wherein said control circuit comprises a switch element for inputting a voltage to the input portion of said amplification device.

7. An apparatus according to claim 1, wherein said control circuit continues to supply the second voltage to the input portion of the amplification device included in a non-selected pixel during a time period in which the signals of said plurality of pixels are read out sequentially therefrom.

8. An apparatus according to claim 1, wherein the pixel includes a transfer switch arranged to transfer the signal of said photoelectric conversion device to the input portion of said amplification device.

9. An apparatus according to claim 8, wherein said transfer circuit comprises a transistor inserted between said photoelectric conversion device and the input portion of said amplification device.

* * * * *

UNITED STATES PATENT AND TRADEMARK OFFICE
CERTIFICATE OF CORRECTION

PATENT NO. : 6,650,369 B2  Page 1 of 1
DATED : November 18, 2003
INVENTOR(S) : Toru Koizumi et al.

It is certified that error appears in the above-identified patent and that said Letters Patent is hereby corrected as shown below:

Column 9,
Line 15, "FIG.2." should read -- FIG. 9. --.

Signed and Sealed this

Fourteenth Day of September, 2004

JON W. DUDAS
*Director of the United States Patent and Trademark Office*